(12) United States Patent
Kim et al.

(10) Patent No.: US 8,513,057 B2
(45) Date of Patent: Aug. 20, 2013

(54) INTEGRATED CIRCUIT PACKAGING SYSTEM WITH ROUTABLE UNDERLAYER AND METHOD OF MANUFACTURE THEREOF

(75) Inventors: Oh Han Kim, Ichon-si (KR); Ki Youn Jang, Ichon-si (KR); DaeSik Choi, Seoul (KR); DongSoo Moon, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 81 days.

(21) Appl. No.: 13/235,135

(22) Filed: Sep. 16, 2011

(65) Prior Publication Data

US 2013/0069224 A1  Mar. 21, 2013

(51) Int. Cl.
*H01L 21/44* (2006.01)
*H01L 21/48* (2006.01)
*H01L 21/50* (2006.01)

(52) U.S. Cl.
USPC ........... 438/106; 438/127; 438/686; 257/678; 257/E21.006; 257/E21.32; 257/E21.499; 257/E21.502; 257/E21.503; 257/E21.508; 257/E21.509; 257/E21.511; 257/E21.517

(58) Field of Classification Search
USPC ................. 438/106, 112, 118, 119, 121, 122, 438/124, 125, 126, 127, 686, 687, 688; 257/678, E21.006, E21.32, E21.499, E21.502, 257/E21.503, E21.508, E21.509, E21.511, 257/E21.517
See application file for complete search history.

(56) References Cited

U.S. PATENT DOCUMENTS

| | | | |
|---|---|---|---|
| 6,853,065 B2 | 2/2005 | Tanaka et al. | |
| 7,185,426 B1 | 3/2007 | Hiner et al. | |
| 7,208,825 B2 | 4/2007 | Pu et al. | |
| 7,528,009 B2 | 5/2009 | Chen et al. | |
| 7,557,443 B2 | 7/2009 | Ye et al. | |
| 8,039,304 B2 * | 10/2011 | Pagaila | 438/107 |
| 2007/0272994 A1 | 11/2007 | Huang et al. | |
| 2008/0166831 A1 | 7/2008 | Huang et al. | |
| 2010/0025833 A1 | 2/2010 | Pagaila et al. | |
| 2010/0033941 A1 | 2/2010 | Pagaila et al. | |
| 2011/0037169 A1 | 2/2011 | Pagaila | |

\* cited by examiner

*Primary Examiner* — David Nhu
(74) *Attorney, Agent, or Firm* — Ishimaru & Associates LLP; I-Chang John Yang

(57) ABSTRACT

A method of manufacture of an integrated circuit packaging system includes: providing a routable layer having a column; mounting an integrated circuit structure in direct contact with the column; and forming a gamma connector to electrically connect the column to the integrated circuit structure.

20 Claims, 7 Drawing Sheets

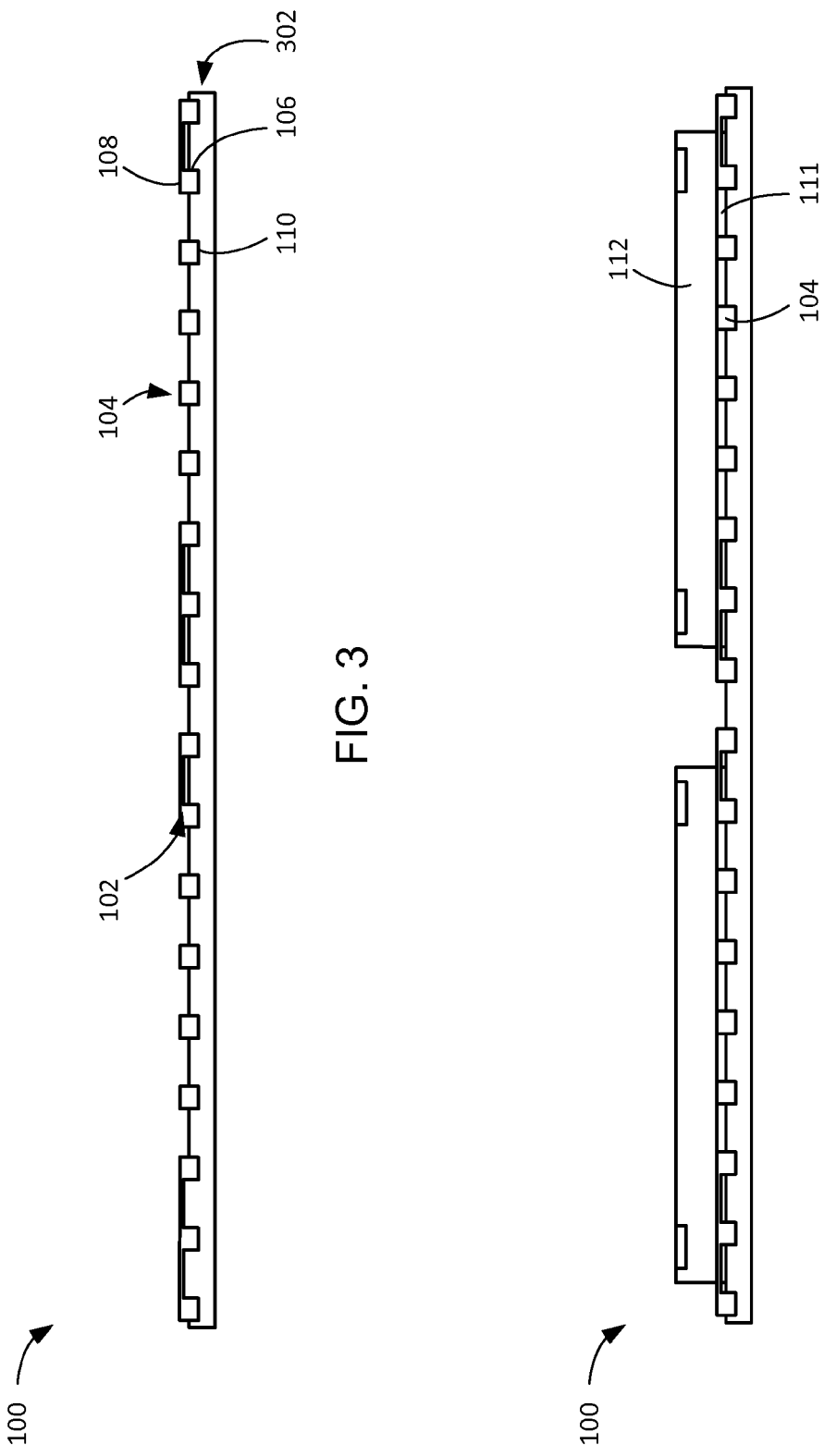

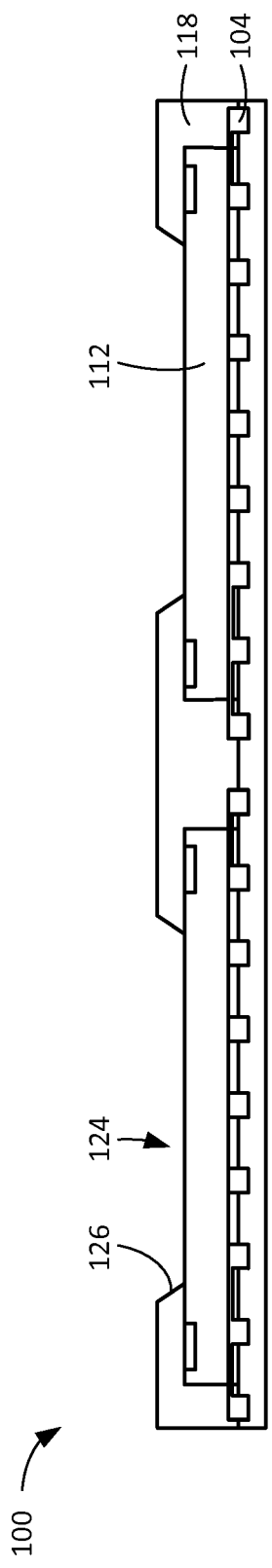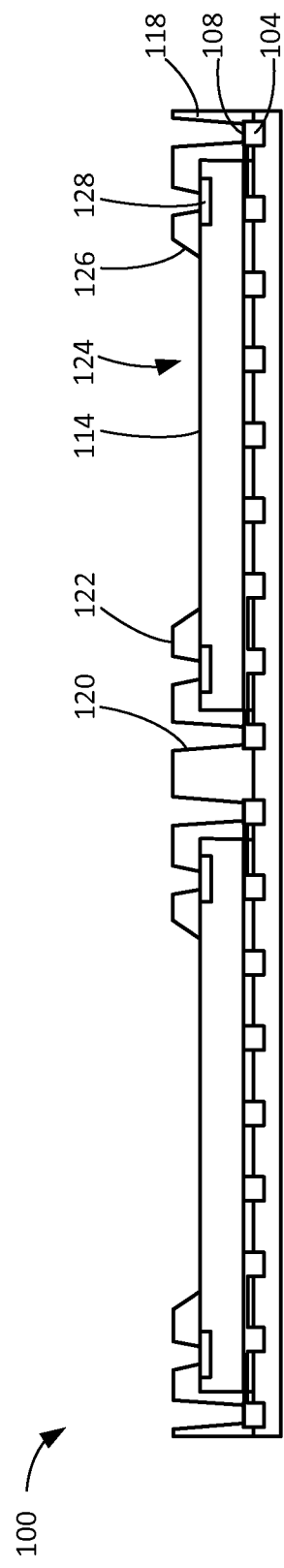

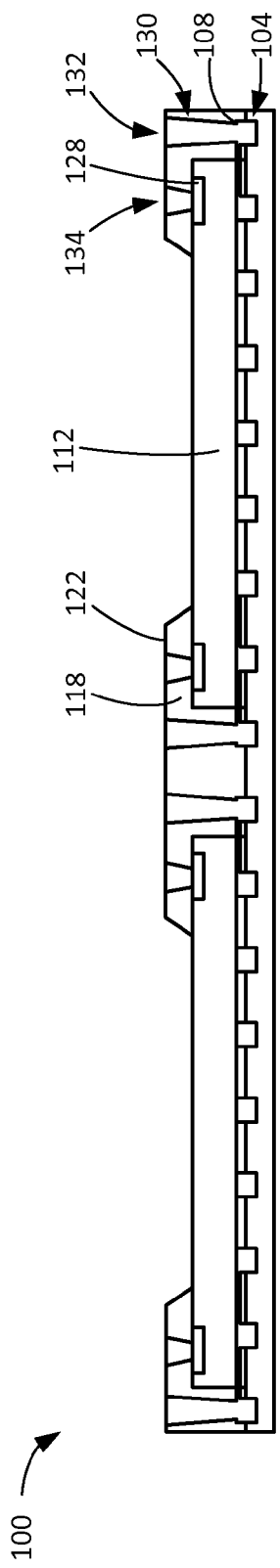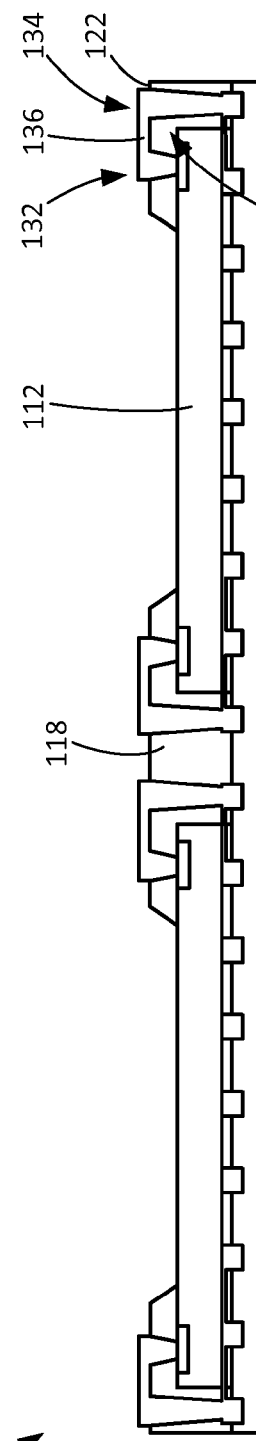

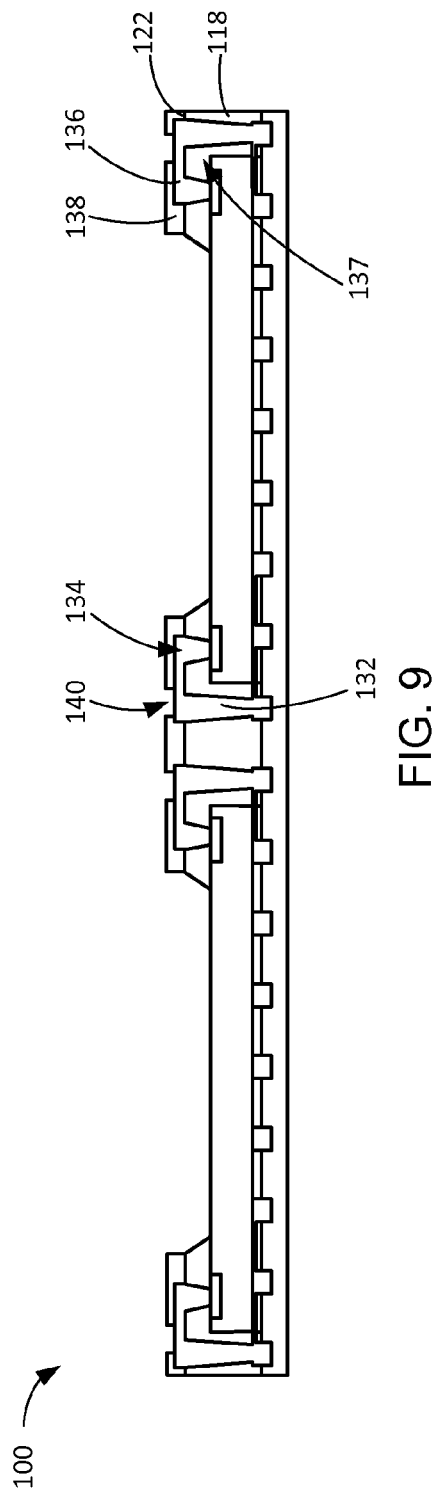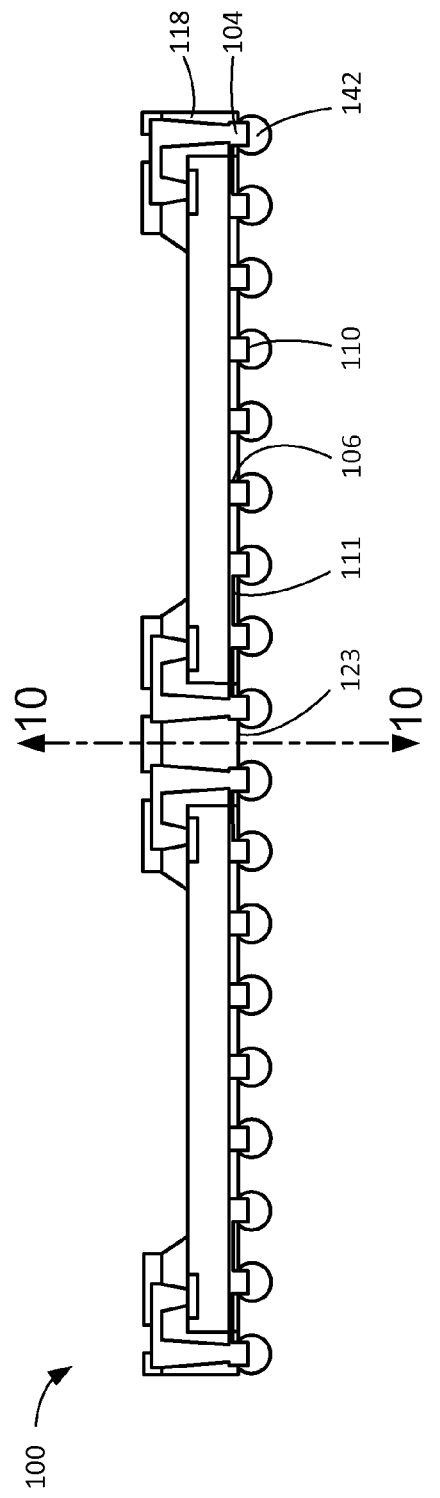

US 8,513,057 B2

INTEGRATED CIRCUIT PACKAGING SYSTEM WITH ROUTABLE UNDERLAYER AND METHOD OF MANUFACTURE THEREOF

TECHNICAL FIELD

The present invention relates generally to an integrated circuit packaging system and more particularly to a system for utilizing a routable layer with an integrated circuit structure in an integrated circuit packaging system.

BACKGROUND

The rapidly growing market for portable electronic devices, e.g. cellular phones, laptop computers, and personal digital assistants (PDAs), is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems can be more intelligent, have higher density, use less power, operate at higher speed, and can include mixed technology devices and assembly structures at lower cost than today.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system, including: providing a routable layer having a column; mounting an integrated circuit structure in direct contact with the column; and forming a gamma connector to electrically connect the column to the integrated circuit structure.

The present invention provides an integrated circuit packaging system, including: a routable layer having a column; an integrated circuit structure mounted in direct contact with the column; and a gamma connector formed to electrically connect the column to the integrated circuit structure.

Certain embodiments of the invention have other steps or elements in addition to or in place of those mentioned above. The steps or elements will become apparent to those skilled in the art from a reading of the following detailed description when taken with reference to the accompanying drawings.

BRIEF DESCRIPTION OF THE DRAWINGS

FIG. 3 is a cross-sectional view of the integrated circuit packaging system of FIG. 1 after carrier phase of manufacture.

FIG. 4 is a cross-sectional view of the integrated circuit packaging system of FIG. 3 after a chip mounting phase of manufacture.

FIG. 5 is a cross-sectional view of the integrated circuit packaging system of FIG. 4 after a molding phase of manufacture.

FIG. 6 is a cross-sectional view of the integrated circuit packaging system of FIG. 5 after a hole formation phase of manufacture.

FIG. 7 is a cross-sectional view of the integrated circuit packaging system of FIG. 6 after a filling phase of manufacture.

FIG. 8 is a cross-sectional view of the integrated circuit packaging system of FIG. 7 after a trace formation phase of manufacture.

FIG. 9 is a cross-sectional view of the integrated circuit packaging system of FIG. 8 after an insulation formation phase of manufacture.

FIG. 10 is a cross-sectional view of the integrated circuit packaging system of FIG. 9 after a bump phase of manufacture.

BEST MODE FOR CARRYING OUT THE INVENTION

Figure 1:
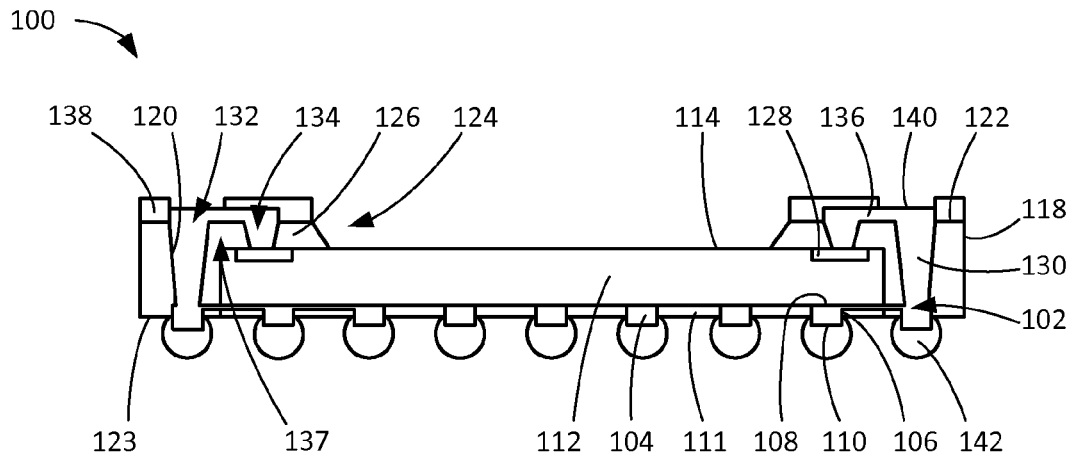
FIG. 1 is a cross-sectional view of an integrated circuit packaging system along the line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes can be made without departing from the scope of the present invention.

In the following description, numerous specific details are given to provide a thorough understanding of the invention. However, it will be apparent that the invention can be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

In addition, where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of the active side of the integrated circuit structure, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements without having any intervening material.

The term "processing" as used herein includes deposition of material or photoresist, patterning, exposure, development, etching, cleaning, and/or removal of the material or photoresist as required in forming a described structure.

Figure 2:
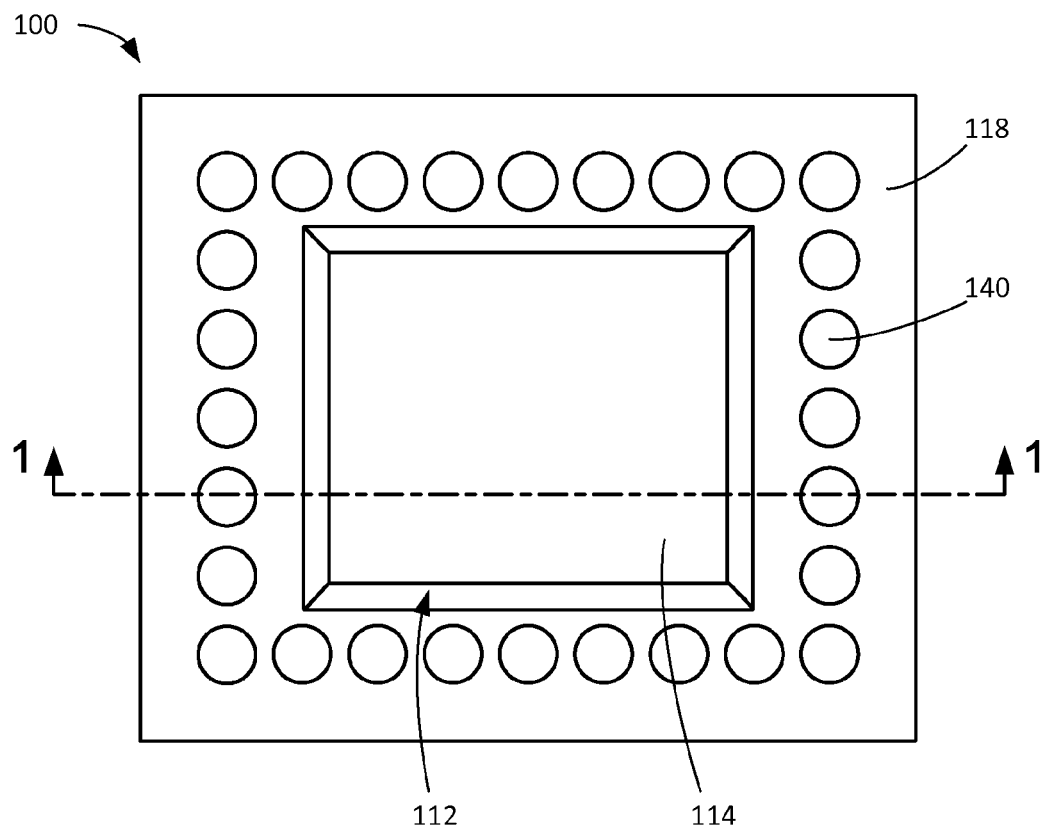
FIG. 2 is a top view of the integrated circuit packaging system of FIG. 1.

Referring now to FIG. 1, therein is shown a cross-sectional view of an integrated circuit packaging system 100 along the line 1-1 of FIG. 2 in a first embodiment of the present invention. As an exemplary illustration, the integrated circuit package system 100 can generally be used within a portable electronic device that requires a high level of functional integration, such as a cellphone or computer. The integrated circuit packaging system 100 is shown having a routable layer 102. The routable layer 102 includes columns 104 having vertical sides 106, top surfaces 108 and bottom surfaces 110.

The routable layer 102 channels and electrically connects the columns 104. The routable layer 102 is defined as a layer fabricated to distribute, route, and channel electrical signals between the columns 104. The routable layer 102 can be a metal such as gold or nickel, but can also be a conductive polymer or composite.

The columns 104 of the routable layer 102 can be arranged as an array, or arranged to interface with a board level system, or arranged to increase input/output density, heat dissipation, or power distribution. The columns 104 can be arranged in regular rows or staggered rows, or can also be arranged as a perimeter of a geometric pattern like a square or circle.

A die attach adhesive 111 attached to an integrated circuit structure 112 can be mounted to the columns 104 of the routable layer 102. The die attach adhesive 111 can surround portions of the vertical sides 106 of the columns 104. Portions of the vertical sides 106 of the columns 104 can also be exposed from the die attach adhesive 111 near the bottom surfaces 110. The columns 104 can extend entirely through the die attach adhesive 111 and make direct contact with the integrated circuit structure 112 at the top surfaces 108 and be exposed from the die attach adhesive 111 along the vertical sides 106 near the bottom surfaces 110. The bottom surfaces 110 can also be exposed from the die attach adhesive 111.

The integrated circuit structure 112 is depicted as an integrated circuit die having an active side 114 facing up but can also be an integrated circuit package or a through silicon via die. The active side 114 is defined as a surface having active circuitry fabricated thereon.

The integrated circuit structure 112 is encapsulated by an encapsulation 118. The encapsulation 118 is defined as a structure that protects sensitive components from moisture, dust and other contamination providing a hermetic seal. The encapsulation 118 can be film assist molding, transfer molding, or other encasement structures.

The encapsulation 118 is processed to have interior sloped edges 120. The interior sloped edges 120 can be formed by laser ablation of the encapsulation 118 from a top side 122 of the encapsulation 118 to a bottom side 123 of the encapsulation 118. The encapsulation 118 is further depicted having an opening 124 that exposes the active side 114 of the integrated circuit structure 112 from the encapsulation 118 between mold risers 126 that extend from the top side 122 of the encapsulation 118 to the active side 114 of the integrated circuit structure 112 and from the sloped edges 120 to the perimeter of the encapsulation 118.

The encapsulation 118 can be shown covering the active side 114 of the integrated circuit structure 112 over bonding pads 128. The encapsulation 118 can be in direct contact with portions of the bonding pads 128 but the interior sloped edges 120 formed over the integrated circuit structure 112 also expose portions of the bonding pads 128 from the encapsulation 118. The bonding pads 128 are partially covered by the encapsulation 118 and partially not covered by the encapsulation 118, as an example.

The bottom side 123 of the encapsulation 118 is coplanar with the die attach adhesive 111. The encapsulation 118 can be in direct contact with portions of the top surfaces 108 of the columns 104 and portions of the vertical sides 106 of the columns 104. The interior sloped edges 120 of the encapsulation 118 also expose portions of the top surfaces 108 of the columns 104 from the encapsulation 118. Portions of the vertical sides 106 and portions of the top surfaces 108 are covered by the encapsulation 118 while other portions of the vertical sides 106 and other portions of the top surfaces 108 are not covered by the encapsulation 118.

The interior sloped edges 120 through the encapsulation 118 are filled with a conductive material such as copper, aluminum, or a conductive polymer to create vias 130 surrounded by the encapsulation 118. The vias 130 extend from the top side 122 of the encapsulation 118 to the top surfaces 108 of the columns 104. The vias 130 also extend from the top side 122 to the bonding pads 128 of the integrated circuit structure 112. The vias 130 can be described as long vias 132 extending from the top side 122 of the encapsulation 118 to top surfaces 108 of the columns 104 and short vias 134 extending from the top side 122 to the active side 114 of the integrated circuit structure 112.

It has been discovered that utilizing the routable layer 102 having the columns 104 in combination with the vias 130 and the integrated circuit structure 112 greatly increases functionality and input/output density of the integrated circuit packaging system 100 while simultaneously reducing the height of the total integrated circuit packaging system 100. Further it has been discovered that utilizing the columns 104 in combination with the vias 130 greatly increases the mechanical reliability and signal transmission capability of the integrated circuit packaging system 100.

The short vias 134 are directly connected to the bonding pads 128 of the integrated circuit structure 112. The vias 130 are shown having a tapered shape being broader near the top side 122 of the encapsulation 118 and narrower near the bottom side 123 of the encapsulation 118 or the integrated circuit structure 112. The vias 130 are defined as a conductive structure fully traversing the encapsulation 118 in a vertical direction having the physical characteristics of a conductive material being filled into the interior sloped edges 120 including an exterior surface incorporating marks and textures of the interior sloped edges 120.

It has been discovered that the vias 130 can be created to different depths based on the position of the integrated circuit structure 112 within the integrated circuit packaging system 100 by setting the position and parameters of the laser ablation equipment, which decreases the complexity of creating the interior sloped edges 120. It has further been discovered that the combination of the vias 130 and the encapsulation 118 greatly stabilizes the integrated circuit packaging system 100 adding to the structural rigidity of the encapsulation and preventing the warping of the encapsulation 118, which greatly increases the reliability of the integrated circuit packaging system 100.

The long vias 132 and the short vias 134 are connected by a redistribution layer 136 deposited and formed in direct contact with the top side 122 of the encapsulation 118 to form a gamma connector 137. The redistribution layer 136 electrically connects the integrated circuit structure 112 to the long vias 132 through the short vias 134. The redistribution layer 136 is defined as a layer fabricated to distribute, route, and channel electrical signals from one contact point to another contact point. The gamma connector 137 is defined as a connector that includes the long vias 132 directly connected to the redistribution layer 136 directly connected to the short vias 134. The gamma connector 137 is shown in direct contact with the bonding pads 128 on the active side 114 of the integrated circuit structure 112 and in direct contact with the columns 104 of the routable layer 102 for forming an electrical connection therebetween.

The columns 104 of the routable layer 102 can be arranged to fan out the input/output connections between the integrated circuit structure 112 and a board level system. The fan out layout can greatly increase the number of columns available for connection external to the integrated circuit packaging system 100.

It has been discovered that the redistribution layer 136 in combination with the vias 130 improves reliability by reducing shorting that could occur with bond wires because the vias 130 are not free to move. It has further been discovered that the redistribution layer 136 in combination with the vias 130 improves reliability by reducing snowballing, which will increase impedance and voltage drop across electrical connections.

It has still further been discovered that the redistribution layer 136 in combination with the vias 130 can lower costs by eliminating the aforementioned problems while reducing overall complexity. Yet further, it has been discovered that the long vias 132 coupled to the columns 104 help provide mold interlock with the encapsulation 118 improving the moisture sensitivity level of the integrated circuit packaging system 100 and reducing delamination.

The encapsulation 118 can be covered by an insulator mask 138 formed in direct contact with the top side 122. The insulator mask 138 is also formed beside and over the redistribution layer 136. The insulator mask 138 can be patterned over the redistribution layer 136 and the encapsulation 118 to expose only a portion of the redistribution layer 136 near the long vias 132.

The redistribution layer 136 exposed from the insulator mask 138 forms connection pads 140 for further connections and multi-stack capability. Connectivity is also increased by the formation of bumps 142 below the encapsulation 118 and in direct contact with the long vias 132. The bumps 142 are attached beside and below the long vias 132.

It has been discovered that the insulator mask 138 in combination with the redistribution layer 136 and the vias 130 increases the number of connections available for signal transfer by increasing the fan-in capability of the integrated circuit structure 112. It has been also discovered that the redistribution layer 136 in combination with the vias 130 reduce the overall height and profile of the integrated circuit packaging system 100 by creating precise and compact z-interconnections through the encapsulation 118 eliminating the need for bond wires. Yet still further, it has been discovered that the redistribution layer in combination with the vias 130 increase connection density by allowing a finer pitch of the connection pads 140. The pitch of the connection pads 140 can be closer that traditional wire bond pads because there is no movement or wire sweep present in the redistribution layer 136 in combination with the vias 130.

Referring now to FIG. 2, therein is shown a top view of the integrated circuit packaging system 100 of FIG. 1. The integrated circuit packaging system 100 is shown having the encapsulation 118 surrounding the connection pads 140 and the active side 114 of the integrated circuit structure 112. The connection pads 140 can be shown surrounding the integrated circuit structure 112 along the entire perimeter of the integrated circuit packaging system 100 but can also be arranged along one or more edges of the integrated circuit structure 112 to best interface with external packages (not shown).

Referring now to FIG. 3, therein is shown a cross-sectional view of the integrated circuit packaging system 100 of FIG. 1 after carrier phase of manufacture. The integrated circuit packaging system 100 is shown having a carrier 302 provided with the routable layer 102 attached thereto. The carrier 302 can be a metal such as copper or silver or can be a glass or polymer. The columns 104 are shown patterned on the carrier 302 with the vertical sides 106 extending vertically from the bottom surfaces 110 on the carrier 302 to the top surfaces 108 away from the carrier 302.

Referring now to FIG. 4, therein is shown a cross-sectional view of the integrated circuit packaging system 100 of FIG. 3 after a chip mounting phase of manufacture. The integrated circuit packaging system 100 is shown having the integrated circuit structure 112 mounted over the columns 104 and attached thereto with the die attach adhesive 111.

Referring now to FIG. 5, therein is shown a cross-sectional view of the integrated circuit packaging system of FIG. 4 after a molding phase of manufacture. The integrated circuit packaging system 100 is shown having the integrated circuit structure 112 and the columns 104 covered by the encapsulation 118. The opening 124 and the mold risers 126 can be formed as the encapsulation 118 is molded over the integrated circuit structure 112 or can be formed in a separate phase of manufacture.

Referring now to FIG. 6, therein is shown a cross-sectional view of the integrated circuit packaging system 100 of FIG. 5 after a hole formation phase of manufacture. The integrated circuit packaging system 100 is shown having the interior sloped edges 120 formed through the encapsulation 118. The interior sloped edges 120 are shown exposing portions of the top surfaces 108 as well as exposing the bonding pads 128.

The interior sloped edges 120 are shown traversing the encapsulation 118 from the top side 122 to the bonding pads 128 and from the top side 122 to the top surfaces 108 of the columns 104. The active side 114 is also shown exposed in the opening 124 between the mold risers 126 of the encapsulation 118.

Referring now to FIG. 7, therein is shown a cross-sectional view of the integrated circuit packaging system 100 of FIG. 6 after a filling phase of manufacture. The integrated circuit packaging system 100 is shown having the vias 130 formed by deposition or electro-plating process onto the bonding pads 128 of the integrated circuit structure 112 to create the short vias 134. The long vias 132 are formed by deposition or electro-plating onto the top surfaces 108 of the columns 104. The vias 130 are formed fully through the encapsulation 118 from the top side 122 to the columns 104 or the bonding pads 128.

It has been discovered that electro-plating the vias 130 considerably reduces the cost of creating connections within the integrated circuit packaging system 100. Further, it has been discovered that formation of the vias 130 by electro-plating greatly reduces complexity and simultaneously increases reliability of the integrated circuit packaging system 100.

Referring now to FIG. 8, therein is shown a cross-sectional view of the integrated circuit packaging system 100 of FIG. 7 after a trace formation phase of manufacture. The integrated circuit packaging system 100 is shown having the redistribution layer 136 contacting the short vias 134 to the long vias 132 to form the gamma connector 137.

The redistribution layer 136 electrically connects the integrated circuit structure 112 to the long vias 132 through the short vias 134 and formed directly on the top side 122 of the encapsulation 118. The gamma connector 137 is defined as a connector that includes the long vias 132 directly connected to the redistribution layer 136 directly connected to the short vias 134.

Referring now to FIG. 9, therein is shown a cross-sectional view of the integrated circuit packaging system 100 of FIG. 8 after an insulation formation phase of manufacture. The integrated circuit packaging system 100 is shown having the insulator mask 138 formed in direct contact with the top side 122 of the encapsulation 118. The insulator mask 138 is also formed beside and over the gamma connector 137. The insulator mask 138 covers part of the redistribution layer 136 near the short vias 134. The insulator mask 138 does not cover part of the redistribution layer 136 near the long vias 132 leaving the redistribution layer 136 exposed from the insulator mask 138 near the long vias 132 but covered and protected by the insulator mask 138 near the short vias 134 to form the connection pads 140 directly over the long vias 132.

The insulator mask 138 can be formed by coating the integrated circuit packaging system 100 with a photolithographic solder resist. The photolithographic solder resist can then be exposed to ultraviolet or infrared radiation. After exposure, the photolithographic solder resist can be developed to expose the connection pads 140 from the insulator mask 138. Alternatively, the top side 122 of the encapsulation 118 can be coated with the insulator mask 138 with a screening method where a screen (not shown) can be used to stop the insulator mask 138 from covering the connection pads 140.

Referring now to FIG. 10, therein is shown a cross-sectional view of the integrated circuit packaging system 100 of FIG. 9 after a bump phase of manufacture. The integrated circuit packaging system 100 is shown, after the carrier 302 of FIG. 3 has been removed, having the bumps 142 below the encapsulation 118 and in direct contact with the columns 104. A singulation line 10-10 depicts a singulation path for a singulation process.

The bumps 142 can be shown in direct contact with the bottom side 123 of the encapsulation 118 and in direct contact with the die attach adhesive 111. The bumps 142 can cover the exposed portions of the columns 104 at the bottom surfaces 110 and the vertical sides 106 near the bottom surfaces 110.

Figure 11:
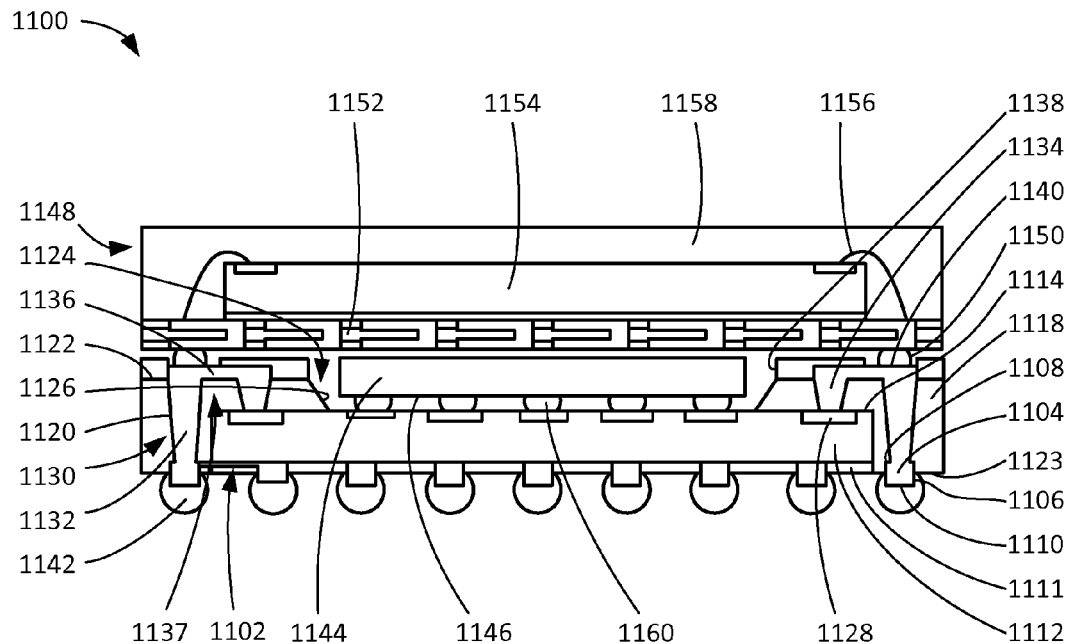
FIG. 11 is a cross-sectional view of an integrated circuit packaging system in a second embodiment of the present invention.

Referring now to FIG. 11, therein is shown a cross-sectional view of an integrated circuit packaging system 1100 in a second embodiment of the present invention. The integrated circuit packaging system 1100 is shown having a routable layer 1102. The routable layer 1102 includes columns 1104 having vertical sides 1106, top surfaces 1108 and bottom surfaces 1110.

The routable layer 1102 channels and electrically connects the columns 1104. The routable layer 1102 is defined as a layer fabricated to distribute, route, and channel electrical signals between the columns 1104. The routable layer 1102 can be a metal such as gold or nickel, but can also be a conductive polymer or composite.

A die attach adhesive 1111 attached to an integrated circuit structure 1112 can be mounted to the columns 1104 of the routable layer 1102. The die attach adhesive 1111 can surround portions of the vertical sides 1106 of the columns 1104. Portions of the vertical sides 1106 of the columns 1104 can also be exposed from the die attach adhesive 1111 near the bottom surfaces 1110. The columns 1104 can extend entirely through the die attach adhesive 1111 and make direct contact with the integrated circuit structure 1112 at the top surfaces 1108 and be exposed from the die attach adhesive 1111 along the vertical sides 1106 near the bottom surfaces 1110. The bottom surfaces 1110 can also be exposed from the die attach adhesive 1111.

The integrated circuit structure 1112 is depicted as an integrated circuit die having an active side 1114 facing up but can also be an integrated circuit package or a through silicon via die. The active side 1114 is defined as a surface having active circuitry fabricated thereon.

The integrated circuit structure 1112 is encapsulated by an encapsulation 1118. The encapsulation 1118 is defined as a structure that protects sensitive components from moisture, dust and other contamination providing a hermetic seal. The encapsulation 1118 can be film assist molding, transfer molding, or other encasement structures.

The encapsulation 1118 is processed to have interior sloped edges 1120. The interior sloped edges 1120 can be formed by laser ablation of the encapsulation 1118 from a top side 1122 of the encapsulation 1118 to a bottom side 1123 of the encapsulation 1118. The encapsulation 1118 is further depicted having an opening 1124 that exposes the active side 1114 of the integrated circuit structure 1112 from the encapsulation 1118 between mold risers 1126 that extend from the top side 1122 of the encapsulation 1118 to the active side 1114 of the integrated circuit structure 1112 and from the sloped edges 1120 to the perimeter of the encapsulation 1118.

The encapsulation 1118 can be shown covering the active side 1114 of the integrated circuit structure 1112 over bonding pads 1128. The encapsulation 1118 can be in direct contact with portions of the bonding pads 1128 but the interior sloped edges 1120 formed over the integrated circuit structure 1112 also expose portions of the bonding pads 1128 from the encapsulation 1118. The bonding pads 1128 are partially covered by the encapsulation 1118 and partially not covered by the encapsulation 1118, as an example.

The bottom side 1123 of the encapsulation 1118 is coplanar with the die attach adhesive 1111. The encapsulation 1118 can be in direct contact with portions of the top surfaces 1108 of the columns 1104 and portions of the vertical sides 1106 of the columns 1104. The interior sloped edges 1120 of the encapsulation 1118 also expose portions of the top surfaces 1108 of the columns 1104 from the encapsulation 1118. Portions of the vertical sides 1106 and portions of the top surfaces 1108 are covered by the encapsulation 1118 while other portions of the vertical sides 1106 and other portions of the top surfaces 1108 are not covered by the encapsulation 1118.

The interior sloped edges 1120 through the encapsulation 1118 are filled with a conductive material such as copper, aluminum, or a conductive polymer to create vias 1130 surrounded by the encapsulation 1118. The vias 1130 extend from the top side 1122 of the encapsulation 1118 to the top surfaces 1108 of the columns 1104. The vias 1130 also extend from the top side 1122 to the bonding pads 1128 of the integrated circuit structure 1112. The vias 1130 can be described as long vias 1132 extending from the top side 1122 of the encapsulation 1118 to top surfaces 1108 of the columns 1104 and short vias 1134 extending from the top side 1122 to the active side 1114 of the integrated circuit structure 1112.

It has been discovered that utilizing the routable layer 1102 having the columns 1104 in combination with the vias 1130 and the integrated circuit structure 1112 greatly increases functionality and input/output density of the integrated circuit packaging system 1100 while simultaneously reducing the height of the total integrated circuit packaging system 1100. Further it has been discovered that utilizing the columns 1104 in combination with the vias 1130 greatly increases the mechanical reliability and signal transmission capability of the integrated circuit packaging system 1100.

The short vias 1134 are directly connected to the bonding pads 1128 of the integrated circuit structure 1112. The vias 1130 are shown having a tapered shape being broader near the top side 1122 of the encapsulation 1118 and narrower near the bottom side 1123 of the encapsulation 1118 or the integrated circuit structure 1112. The vias 1130 are defined as a conductive structure fully traversing the encapsulation 1118 in a vertical direction having the physical characteristics of a conductive material being filled into the interior sloped edges 1120 including an exterior surface incorporating marks and textures of the interior sloped edges 1120.

It has been discovered that the vias 1130 can be created to different depths based on the position of the integrated circuit structure 1112 within the integrated circuit packaging system 1100 by setting the position and parameters of the laser ablation equipment, which decreases the complexity of creating the interior sloped edges 1120. It has further been discovered that the combination of the vias 1130 and the encapsulation 1118 greatly stabilizes the integrated circuit packaging system 1100 adding to the structural rigidity of the encapsulation and preventing the warping of the encapsulation 1118, which greatly increases the reliability of the integrated circuit packaging system 1100.

The long vias 1132 and the short vias 1134 are connected by a redistribution layer 1136 deposited and formed in direct contact with the top side 1122 of the encapsulation 1118 to form a gamma connector 1137. The redistribution layer 1136 electrically connects the integrated circuit structure 1112 to the long vias 1132 through the short vias 1134. The redistribution layer 1136 is defined as a layer fabricated to distribute, route, and channel electrical signals from one contact point to another contact point. The gamma connector 1137 is defined as a connector that includes the long vias 1132 directly connected to the redistribution layer 1136 directly connected to the short vias 1134. The gamma connector 1137 is shown in direct contact with the bonding pads 1128 on the active side 1114 of the integrated circuit structure 1112 and in direct contact with the columns 1104 of the routable layer 1102 for forming an electrical connection therebetween.

The columns 1104 of the routable layer 1102 can be arranged to fan out the input/output connections between the integrated circuit structure 1112 and a board level system. The fan out layout can greatly increase the number of columns available for connection external to the integrated circuit packaging system 1100.

It has been discovered that the redistribution layer 1136 in combination with the vias 1130 improves reliability by reducing shorting that could occur with bond wires because the vias 1130 are not free to move. It has further been discovered that the redistribution layer 1136 in combination with the vias 1130 improves reliability by reducing snowballing, which will increase impedance and voltage drop across electrical connections. Finally, it has been discovered that the redistribution layer 1136 in combination with the vias 1130 can lower costs by eliminating the aforementioned problems while reducing overall complexity.

The encapsulation 1118 can be covered by an insulator mask 1138 formed in direct contact with the top side 1122. The insulator mask 1138 is also formed beside and over the redistribution layer 1136 but covers only part of the redistribution layer 1136 near the short vias 1134. The insulator mask 1138 does not cover part of the redistribution layer 1136 near the long vias 1132. The insulator mask 1138 can be patterned over the redistribution layer 1136 and the encapsulation 1118 to expose only a portion of the redistribution layer 1136.

The redistribution layer 1136 exposed from the insulator mask 1138 forms connection pads 1140 for further connections and multi-stack capability. Connectivity is also increased by the formation of bumps 1142 below the encapsulation 1118 and in direct contact with the long vias 1132. The bumps 1142 are attached beside and below the long vias 1132.

It has been discovered that the insulator mask 1138 in combination with the redistribution layer 1136 and the vias 1130 increases the number of connections available for signal transfer by increasing the fan-in capability of the integrated circuit structure 1112. It has been also discovered that the redistribution layer 1136 in combination with the vias 1130 reduce the overall height and profile of the integrated circuit packaging system 1100 by creating precise and compact z-interconnections through the encapsulation 1118 eliminating the need for bond wires. Yet still further, it has been discovered that the redistribution layer in combination with the vias 1130 increase connection density by allowing a finer pitch of the connection pads 1140. The pitch of the connection pads 1140 can be closer that traditional wire bond pads because there is no movement or wire sweep present in the redistribution layer 1136 in combination with the vias 1130.

An external chip 1144 is mounted over and above the integrated circuit structure 1112. The external chip 1144 can be depicted as a flip-chip. The external chip 1144 has an external active side 1146 facing the integrated circuit structure 1112 and is positioned in the opening 1124 between mold risers 1126 of the encapsulation 1118. The external active side 1146 is defined as a surface having active circuitry fabricated thereon.

The external active side 1146 is positioned below a horizontal level of the redistribution layer 1136 and the insulator mask 1138. The connection pads 1140 are connected to a top package 1148 that is mounted above the redistribution layer 1136 and the insulator mask 1138. The top package 1148 is directly connected to the connection pads 1140 with external interconnects 1150.

The top package 1148 is shown having a top substrate 1152. The top substrate 1152 is defined as a structure capable of electrically connection, signal routing and internal isolation, and providing structural support for components to be mounted thereto. The top substrate 1152 can be, but is not limited to, laminated plastic or ceramic.

The top substrate 1152 has a top integrated circuit 1154 mounted there over and connected thereto with internal interconnects 1156. The top substrate 1152 and the top integrated circuit 1154 along with the internal interconnects 1156 are encapsulated with a top encapsulation 1158. The top encapsulation 1158 is defined as a structure that protects sensitive components from moisture, dust and other contamination providing a hermetic seal. The top encapsulation 1158 can be film assist molding, transfer molding, or other encasement structures.

It has been discovered that positioning the external chip 1144 between the mold risers 1126 and with the external active side 1146 below the horizontal level of the redistribution layer 1136 provides unexpected benefits by increasing the stability of the integrated circuit packaging system 1100, which decreases the strain on elements like the integrated circuit structure 1112. This aspect of the invention is made possible because the coefficient of thermal expansion of the external chip 1144 and the integrated circuit structure 1112 is substantially the same. It has further been discovered that positioning the external chip 1144 between the mold risers 1126 and with the external active side 1146 below the horizontal level of the redistribution layer 1136 decreases overall package height and width allowing for product differentiation and greater utility.

It has still further been discovered that positioning the top package 1148 above the encapsulation 1118 and above the external chip 1144 being in the opening 1124 allows for substantial increases in functionality of the integrated circuit packaging system 1100 without sacrificing structural rigidity. The external chip 1144 is shown electrically connected to the active side 1114 with solder balls 1160. Yet further, it has been discovered that the long vias 1132 coupled to the columns 1104 help provide mold interlock with the encapsulation 1118 improving the moisture sensitivity level of the integrated circuit packaging system 1100 and reducing delamination.

Figure 12:
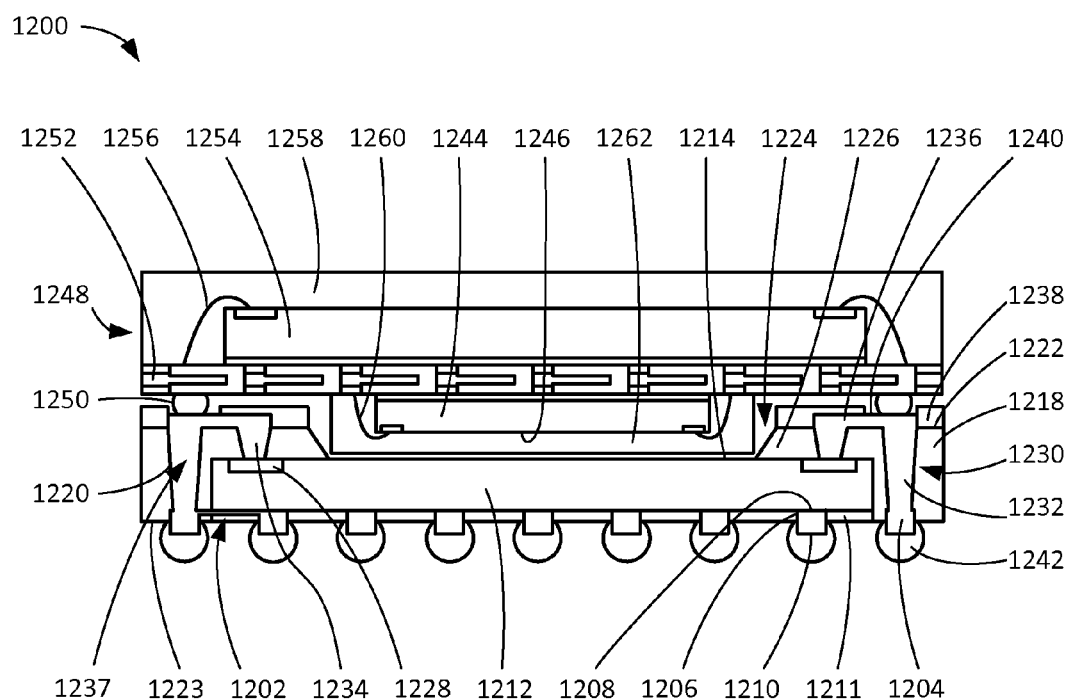
FIG. 12 is a cross-sectional view of an integrated circuit packaging system in a third embodiment of the present invention.

Referring now to FIG. 12, therein is shown a cross-sectional view of an integrated circuit packaging system 1200 in a third embodiment of the present invention. The integrated circuit packaging system 1200 is shown having a routable layer 1202. The routable layer 1202 includes columns 1204 having vertical sides 1206, top surfaces 1208 and bottom surfaces 1210.

The routable layer 1202 channels and electrically connects the columns 1204. The routable layer 1202 is defined as a layer fabricated to distribute, route, and channel electrical signals between the columns 1204. The routable layer 1202 can be a metal such as gold or nickel, but can also be a conductive polymer or composite.

A die attach adhesive 1211 attached to an integrated circuit structure 1212 can be mounted to the columns 1204 of the routable layer 1202. The die attach adhesive 1211 can surround portions of the vertical sides 1206 of the columns 1204. Portions of the vertical sides 1206 of the columns 1204 can also be exposed from the die attach adhesive 1211 near the bottom surfaces 1210. The columns 1204 can extend entirely through the die attach adhesive 1211 and make direct contact with the integrated circuit structure 1212 at the top surfaces 1208 and be exposed from the die attach adhesive 1211 along the vertical sides 1206 near the bottom surfaces 1210. The bottom surfaces 1210 can also be exposed from the die attach adhesive 1211.

The integrated circuit structure 1212 is depicted as an integrated circuit die having an active side 1214 facing up but can also be an integrated circuit package or a through silicon via die. The active side 1214 is defined as a surface having active circuitry fabricated thereon.

The integrated circuit structure 1212 is encapsulated by an encapsulation 1218. The encapsulation 1218 is defined as a structure that protects sensitive components from moisture, dust and other contamination providing a hermetic seal. The encapsulation 1218 can be film assist molding, transfer molding, or other encasement structures.

The encapsulation 1218 is processed to have interior sloped edges 1220. The interior sloped edges 1220 can be formed by laser ablation of the encapsulation 1218 from a top side 1222 of the encapsulation 1218 to a bottom side 1223 of the encapsulation 1218. The encapsulation 1218 is further depicted having an opening 1224 that exposes the active side 1214 of the integrated circuit structure 1212 from the encapsulation 1218 between mold risers 1226 that extend from the top side 1222 of the encapsulation 1218 to the active side 1214 of the integrated circuit structure 1212 and from the sloped edges 1220 to the perimeter of the encapsulation 1218.

The encapsulation 1218 can be shown covering the active side 1214 of the integrated circuit structure 1212 over bonding pads 1228. The encapsulation 1218 can be in direct contact with portions of the bonding pads 1228 but the interior sloped edges 1220 formed over the integrated circuit structure 1212 also expose portions of the bonding pads 1228 from the encapsulation 1218. The bonding pads 1228 are partially covered by the encapsulation 1218 and partially not covered by the encapsulation 1218, as an example.

The bottom side 1223 of the encapsulation 1218 is coplanar with the die attach adhesive 1211. The encapsulation 1218 can be in direct contact with portions of the top surfaces 1208 of the columns 1204 and portions of the vertical sides 1206 of the columns 1204. The interior sloped edges 1220 of the encapsulation 1218 also expose portions of the top surfaces 1208 of the columns 1204 from the encapsulation 1218. Portions of the vertical sides 1206 and portions of the top surfaces 1208 are covered by the encapsulation 1218 while other portions of the vertical sides 1206 and other portions of the top surfaces 1208 are not covered by the encapsulation 1218.

The interior sloped edges 1220 through the encapsulation 1218 are filled with a conductive material such as copper, aluminum, or a conductive polymer to create vias 1230 surrounded by the encapsulation 1218. The vias 1230 extend from the top side 1222 of the encapsulation 1218 to the top surfaces 1208 of the columns 1204. The vias 1230 also extend from the top side 1222 to the bonding pads 1228 of the integrated circuit structure 1212. The vias 1230 can be described as long vias 1232 extending from the top side 1222 of the encapsulation 1218 to top surfaces 1208 of the columns 1204 and short vias 1234 extending from the top side 1222 to the active side 1214 of the integrated circuit structure 1212.

It has been discovered that utilizing the routable layer 1202 having the columns 1204 in combination with the vias 1230 and the integrated circuit structure 1212 greatly increases functionality and input/output density of the integrated circuit packaging system 1200 while simultaneously reducing the height of the total integrated circuit packaging system 1200. Further it has been discovered that utilizing the columns 1204 in combination with the vias 1230 greatly increases the mechanical reliability and signal transmission capability of the integrated circuit packaging system 1200.

The short vias 1234 are directly connected to the bonding pads 1228 of the integrated circuit structure 1212. The vias 1230 are shown having a tapered shape being broader near the top side 1222 of the encapsulation 1218 and narrower near the bottom side 1223 of the encapsulation 1218 or the integrated circuit structure 1212. The vias 1230 are defined as a conductive structure fully traversing the encapsulation 1218 in a vertical direction having the physical characteristics of a conductive material being filled into the interior sloped edges 1220 including an exterior surface incorporating marks and textures of the interior sloped edges 1220.

It has been discovered that the vias 1230 can be created to different depths based on the position of the integrated circuit structure 1212 within the integrated circuit packaging system 1200 by setting the position and parameters of the laser ablation equipment, which decreases the complexity of creating the interior sloped edges 1220. It has further been discovered that the combination of the vias 1230 and the encapsulation 1218 greatly stabilizes the integrated circuit packaging system 1200 adding to the structural rigidity of the encapsulation and preventing the warping of the encapsulation 1218, which greatly increases the reliability of the integrated circuit packaging system 1200.

The long vias 1232 and the short vias 1234 are connected by a redistribution layer 1236 deposited and formed in direct contact with the top side 1222 of the encapsulation 1218 to form a gamma connector 1237. The redistribution layer 1236 electrically connects the integrated circuit structure 1212 to the long vias 1232 through the short vias 1234. The redistribution layer 1236 is defined as a layer fabricated to distribute, route, and channel electrical signals from one contact point to another contact point. The gamma connector 1237 is defined as a connector that includes the long vias 1232 directly connected to the redistribution layer 1236 directly connected to the short vias 1234. The gamma connector 1237 is shown in direct contact with the bonding pads 1228 on the active side 1214 of the integrated circuit structure 1212 and in direct contact with the columns 1204 of the routable layer 1202 for forming an electrical connection therebetween.

The columns 1204 of the routable layer 1202 can be arranged to fan out the input/output connections between the integrated circuit structure 1212 and a board level system. The fan out layout can greatly increase the number of columns available for connection external to the integrated circuit packaging system 1200.

It has been discovered that the redistribution layer 1236 in combination with the vias 1230 improves reliability by reducing shorting that could occur with bond wires because the vias 1230 are not free to move. It has further been discovered that the redistribution layer 1236 in combination with the vias 1230 improves reliability by reducing snowballing, which will increase impedance and voltage drop across electrical connections. Finally, it has been discovered that the redistribution layer 1236 in combination with the vias 1230 can lower costs by eliminating the aforementioned problems while reducing overall complexity.

The encapsulation 1218 can be covered by an insulator mask 1238 formed in direct contact with the top side 1222. The insulator mask 1238 is also formed beside and over the redistribution layer 1236 but covers only a portion of the redistribution layer 1236 near the short vias 1234. The insulator mask 1238 does not cover part of the redistribution layer 1236 near the long vias 1232. The insulator mask 1238 can be patterned over the redistribution layer 1236 and the encapsulation 1218 to expose only a portion of the redistribution layer 1236.

The redistribution layer 1236 exposed from the insulator mask 1238 forms connection pads 1240 for further connections and multi-stack capability. Connectivity is also increased by the formation of bumps 1242 below the encapsulation 1218 and in direct contact with the long vias 1232. The bumps 1242 are attached beside and below the long vias 1232.

It has been discovered that the insulator mask 1238 in combination with the redistribution layer 1236 and the vias 1230 increases the number of connections available for signal transfer by increasing the fan-in capability of the integrated circuit structure 1212. It has been also discovered that the redistribution layer 1236 in combination with the vias 1230 reduce the overall height and profile of the integrated circuit packaging system 1200 by creating precise and compact z-interconnections through the encapsulation 1218 eliminating the need for bond wires. Yet still further, it has been discovered that the redistribution layer in combination with the vias 1230 increase connection density by allowing a finer pitch of the connection pads 1240. The pitch of the connection pads 1240 can be closer that traditional wire bond pads because there is no movement or wire sweep present in the redistribution layer 1236 in combination with the vias 1230.

An external chip 1244 is mounted over and above the integrated circuit structure 1212. The external chip 1244 can be depicted as a wire-bonded die. The external chip 1244 has an external active side 1246 facing the integrated circuit structure 1212 and is positioned in the opening 1224 between mold risers 1226 of the encapsulation 1218. The external active side 1246 is defined as a surface having active circuitry fabricated thereon.

The external active side 1246 is positioned below a horizontal level of the redistribution layer 1236 and the insulator mask 1238. The connection pads 1240 are connected to a top package 1248 that is mounted above the redistribution layer 1236 and the insulator mask 1238. The top package 1248 is directly connected to the connection pads 1240 with external interconnects 1250.

The top package 1248 is shown having a top substrate 1252. The top substrate 1252 is defined as a structure capable of electrically connection, signal routing and internal isolation, and providing structural support for components to be mounted thereto. The top substrate 1252 can be, but is not limited to, laminated plastic or ceramic.

The top substrate 1252 has a top integrated circuit 1254 mounted there over and connected thereto with internal interconnects 1256. The top substrate 1252 and the top integrated circuit 1254 along with the internal interconnects 1256 are encapsulated with a first top encapsulation 1258. The first top encapsulation 1258 is defined as a structure that protects sensitive components from moisture, dust and other contamination providing a hermetic seal. The first top encapsulation 1258 can be film assist molding, transfer molding, or other encasement structures.

It has been discovered that positioning the external chip 1244 between the mold risers 1226 and with the external active side 1246 below the horizontal level of the redistribution layer 1236 provides unexpected benefits by increasing the stability of the integrated circuit packaging system 1200, which decreases the strain on elements like the integrated circuit structure 1212. This aspect of the invention is made possible because the coefficient of thermal expansion of the external chip 1244 and the integrated circuit structure 1212 is substantially the same. It has further been discovered that positioning the external chip 1244 between the mold risers 1226 and with the external active side 1246 below the horizontal level of the redistribution layer 1236 decreases overall package height and width allowing for product differentiation and greater utility.

It has still further been discovered that positioning the top package 1248 above the encapsulation 1218 and above the external chip 1244 being in the opening 1224 allows for substantial increases in functionality of the integrated circuit packaging system 1200 without sacrificing structural rigidity. Yet further, it has been discovered that the long vias 1232 coupled to the columns 1204 help provide mold interlock with the encapsulation 1218 improving the moisture sensitivity level of the integrated circuit packaging system 1200 and reducing delamination.

The external chip 1244 is shown electrically connected to the top substrate 1252 with bond wires 1260. The external chip 1244 is also shown encapsulated with a second top encapsulation 1262.

Figure 13:
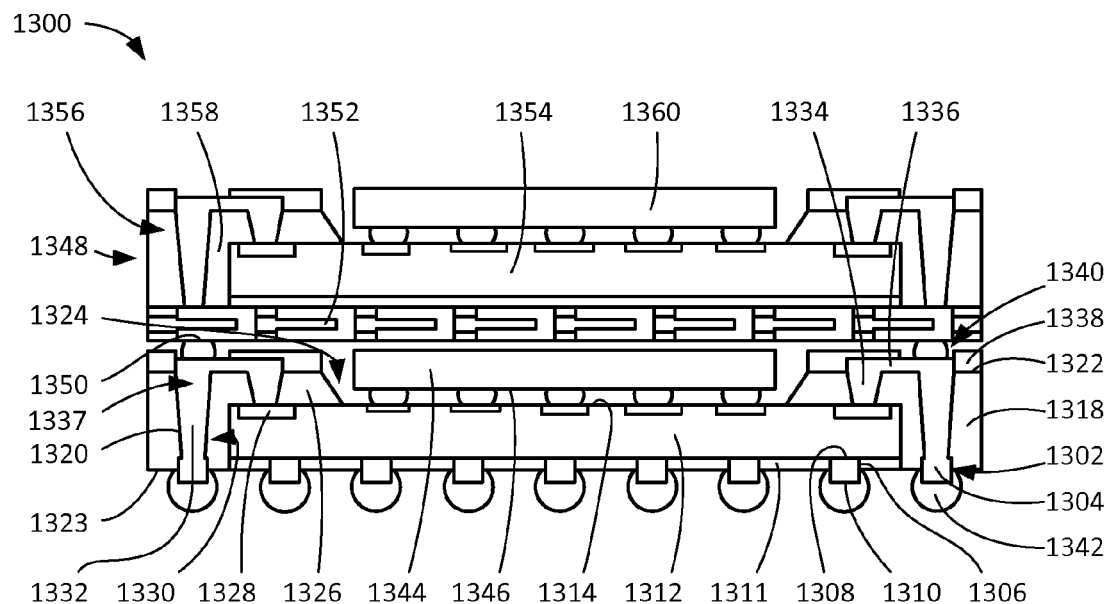
FIG. 13 is a cross-sectional view of an integrated circuit packaging system in a fourth embodiment of the present invention.

Referring now to FIG. 13, therein is shown a cross-sectional view of an integrated circuit packaging system 1300 in a fourth embodiment of the present invention. The integrated circuit packaging system 1300 is shown having a routable layer 1302. The routable layer 1302 includes columns 1304 having vertical sides 1306, top surfaces 1308 and bottom surfaces 1310.

The routable layer 1302 channels and electrically connects the columns 1304. The routable layer 1302 is defined as a layer fabricated to distribute, route, and channel electrical signals between the columns 1304. The routable layer 1302 can be a metal such as gold or nickel, but can also be a conductive polymer or composite.

A die attach adhesive 1311 attached to an integrated circuit structure 1312 can be mounted to the columns 1304 of the routable layer 1302. The die attach adhesive 1311 can surround portions of the vertical sides 1306 of the columns 1304. Portions of the vertical sides 1306 of the columns 1304 can also be exposed from the die attach adhesive 1311 near the bottom surfaces 1310. The columns 1304 can extend entirely through the die attach adhesive 1311 and make direct contact with the integrated circuit structure 1312 at the top surfaces 1308 and be exposed from the die attach adhesive 1311 along the vertical sides 1306 near the bottom surfaces 1310. The bottom surfaces 1310 can also be exposed from the die attach adhesive 1311.

The integrated circuit structure 1312 is depicted as an integrated circuit die having an active side 1314 facing up but can also be an integrated circuit package or a through silicon via die. The active side 1314 is defined as a surface having active circuitry fabricated thereon.

The integrated circuit structure 1312 is encapsulated by an encapsulation 1318. The encapsulation 1318 is defined as a structure that protects sensitive components from moisture, dust and other contamination providing a hermetic seal. The encapsulation 1318 can be film assist molding, transfer molding, or other encasement structures.

The encapsulation 1318 is processed to have interior sloped edges 1320. The interior sloped edges 1320 can be formed by laser ablation of the encapsulation 1318 from a top side 1322 of the encapsulation 1318 to a bottom side 1323 of the encapsulation 1318. The encapsulation 1318 is further depicted having an opening 1324 that exposes the active side 1314 of the integrated circuit structure 1312 from the encapsulation 1318 between mold risers 1326 that extend from the top side 1322 of the encapsulation 1318 to the active side 1314 of the integrated circuit structure 1312 and from the sloped edges 1320 to the perimeter of the encapsulation 1318.

The encapsulation 1318 can be shown covering the active side 1314 of the integrated circuit structure 1312 over bonding pads 1328. The encapsulation 1318 can be in direct contact with portions of the bonding pads 1328 but the interior sloped edges 1320 formed over the integrated circuit structure 1312 also expose portions of the bonding pads 1328 from the encapsulation 1318. The bonding pads 1328 are partially covered by the encapsulation 1318 and partially not covered by the encapsulation 1318, as an example.

The bottom side 1323 of the encapsulation 1318 is coplanar with the die attach adhesive 1311. The encapsulation 1318 can be in direct contact with portions of the top surfaces 1308 of the columns 1304 and portions of the vertical sides 1306 of the columns 1304. The interior sloped edges 1320 of the encapsulation 1318 also expose portions of the top surfaces 1308 of the columns 1304 from the encapsulation 1318. Portions of the vertical sides 1306 and portions of the top surfaces 1308 are covered by the encapsulation 1318 while other portions of the vertical sides 1306 and other portions of the top surfaces 1308 are not covered by the encapsulation 1318.

The interior sloped edges 1320 through the encapsulation 1318 are filled with a conductive material such as copper, aluminum, or a conductive polymer to create vias 1330 surrounded by the encapsulation 1318. The vias 1330 extend from the top side 1322 of the encapsulation 1318 to the top surfaces 1308 of the columns 1304. The vias 1330 also extend from the top side 1322 to the bonding pads 1328 of the integrated circuit structure 1312. The vias 1330 can be described as long vias 1332 extending from the top side 1322 of the encapsulation 1318 to top surfaces 1308 of the columns 1304 and short vias 1334 extending from the top side 1322 to the active side 1314 of the integrated circuit structure 1312.

It has been discovered that utilizing the routable layer 1302 having the columns 1304 in combination with the vias 1330 and the integrated circuit structure 1312 greatly increases functionality and input/output density of the integrated circuit packaging system 1300 while simultaneously reducing the height of the total integrated circuit packaging system 1300. Further it has been discovered that utilizing the columns 1304 in combination with the vias 1330 greatly increases the mechanical reliability and signal transmission capability of the integrated circuit packaging system 1300.

The short vias 1334 are directly connected to the bonding pads 1328 of the integrated circuit structure 1312. The vias 1330 are shown having a tapered shape being broader near the top side 1322 of the encapsulation 1318 and narrower near the bottom side 1323 of the encapsulation 1318 or the integrated circuit structure 1312. The vias 1330 are defined as a conductive structure fully traversing the encapsulation 1318 in a vertical direction having the physical characteristics of a conductive material being filled into the interior sloped edges 1320 including an exterior surface incorporating marks and textures of the interior sloped edges 1320.

It has been discovered that the vias 1330 can be created to different depths based on the position of the integrated circuit structure 1312 within the integrated circuit packaging system 1300 by setting the position and parameters of the laser ablation equipment, which decreases the complexity of creating the interior sloped edges 1320. It has further been discovered that the combination of the vias 1330 and the encapsulation 1318 greatly stabilizes the integrated circuit packaging system 1300 adding to the structural rigidity of the encapsulation and preventing the warping of the encapsulation 1318, which greatly increases the reliability of the integrated circuit packaging system 1300.

The long vias 1332 and the short vias 1334 are connected by a redistribution layer 1336 deposited and formed in direct contact with the top side 1322 of the encapsulation 1318 to form a gamma connector 1337. The redistribution layer 1336 electrically connects the integrated circuit structure 1312 to the long vias 1332 through the short vias 1334. The redistribution layer 1336 is defined as a layer fabricated to distribute, route, and channel electrical signals from one contact point to another contact point. The gamma connector 1337 is defined as a connector that includes the long vias 1332 directly connected to the redistribution layer 1336 directly connected to the short vias 1334. The gamma connector 1337 is shown in direct contact with the bonding pads 1328 on the active side 1314 of the integrated circuit structure 1312 and in direct contact with the columns 1304 of the routable layer 1302 for forming an electrical connection therebetween.

The columns 1304 of the routable layer 1302 can be arranged to fan out the input/output connections between the integrated circuit structure 1312 and a board level system. The fan out layout can greatly increase the number of columns available for connection external to the integrated circuit packaging system 1300.

It has been discovered that the redistribution layer 1336 in combination with the vias 1330 improves reliability by reducing shorting that could occur with bond wires because the vias 1330 are not free to move. It has further been discovered that the redistribution layer 1336 in combination with the vias 1330 improves reliability by reducing snowballing, which will increase impedance and voltage drop across electrical connections. Finally, it has been discovered that the redistribution layer 1336 in combination with the vias 1330 can lower costs by eliminating the aforementioned problems while reducing overall complexity.

The encapsulation 1318 can be covered by an insulator mask 1338 formed in direct contact with the top side 1322. The insulator mask 1338 patterned over the encapsulation 118 and the redistribution layer 136 to expose only a portion of the redistribution layer 136.

The redistribution layer 1336 exposed from the insulator mask 1338 forms connection pads 1340 for further connections and multi-stack capability. Connectivity is also increased by the formation of bumps 1342 below the encapsulation 1318 and in direct contact with the long vias 1332. The bumps 1342 are attached beside and below the long vias 1332.

It has been discovered that the insulator mask 1338 in combination with the redistribution layer 1336 and the vias 1330 increases the number of connections available for signal transfer by increasing the fan-in capability of the integrated circuit structure 1312. It has been also discovered that the redistribution layer 1336 in combination with the vias 1330 reduce the overall height and profile of the integrated circuit packaging system 1300 by creating precise and compact z-interconnections through the encapsulation 1318 eliminating the need for bond wires. Yet still further, it has been discovered that the redistribution layer in combination with the vias 1330 increase connection density by allowing a finer pitch of the connection pads 1340. The pitch of the connection pads 1340 can be closer that traditional wire bond pads because there is no movement or wire sweep present in the redistribution layer 1336 in combination with the vias 1330.

A first external chip 1344 is mounted over and above the integrated circuit structure 1312. The first external chip 1344 can be depicted as a flip-chip. The first external chip 1344 has an external active side 1346 facing the integrated circuit structure 1312 and is positioned in the opening 1324 between mold risers 1326 of the encapsulation 1318. The external active side 1346 is defined as a surface having active circuitry fabricated thereon.

The external active side 1346 is positioned below a horizontal level of the redistribution layer 1336 and the insulator mask 1338. The connection pads 1340 are connected to a top package 1348 that is mounted above the redistribution layer 1336 and the insulator mask 1338. The top package 1348 is directly connected to the connection pads 1340 with external interconnects 1350.

The top package 1348 is shown having a top substrate 1352. The top substrate 1352 is defined as a structure capable of electrically connection, signal routing and internal isolation, and providing structural support for components to be mounted thereto. The top substrate 1352 can be, but is not limited to, laminated plastic or ceramic.

The top substrate 1352 has a top integrated circuit 1354 mounted there over and connected thereto with top vias 1356. The top substrate 1352 and the top integrated circuit 1354 along with the top vias 1356 are encapsulated with a top encapsulation 1358. The top encapsulation 1358 is defined as a structure that protects sensitive components from moisture, dust and other contamination providing a hermetic seal. The top encapsulation 1358 can be film assist molding, transfer molding, or other encasement structures.

It has been discovered that positioning the first external chip 1344 between the mold risers 1326 and with the external active side 1346 below the horizontal level of the redistribution layer 1336 provides unexpected benefits by increasing the stability of the integrated circuit packaging system 1300, which decreases the strain on elements like the integrated circuit structure 1312. This aspect of the invention is made possible because the coefficient of thermal expansion of the first external chip 1344 and the integrated circuit structure 1312 is substantially the same. It has further been discovered that positioning the first external chip 1344 between the mold risers 1326 and with the external active side 1346 below the horizontal level of the redistribution layer 1336 decreases overall package height and width allowing for product differentiation and greater utility.

It has still further been discovered that positioning the top package 1348 above the encapsulation 1318 and above the first external chip 1344 being in the opening 1324 allows for substantial increases in functionality of the integrated circuit packaging system 1300 without sacrificing structural rigidity. A second external chip 1360 is mounted above the top integrated circuit 1354. Yet further, it has been discovered that the long vias 1332 coupled to the columns 1304 help provide mold interlock with the encapsulation 1318 improving the moisture sensitivity level of the integrated circuit packaging system 1300 and reducing delamination.

Figure 14:
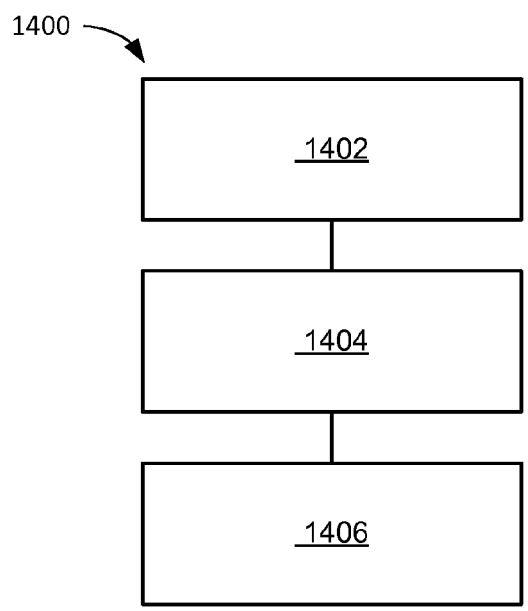
FIG. 14 is a flow chart of a method of manufacture of the integrated circuit packaging system in a further embodiment of the present invention.

Referring now to FIG. 14, therein is shown a flow chart of a method 1400 of manufacture of the integrated circuit packaging system in a further embodiment of the present invention. The method 1400 includes: providing a routable layer having a column in a block 1402; mounting an integrated circuit structure in direct contact with the column in a block 1404; and forming a gamma connector to electrically connect the column to the integrated circuit structure in a block 1406.

Thus, it has been discovered that the integrated circuit packaging system and fan in interposer on lead of the present invention furnishes important and heretofore unknown and unavailable solutions, capabilities, and functional aspects for integrated circuit packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a routable layer having a column;
   mounting an integrated circuit structure in direct contact with the column; and
   forming a gamma connector to electrically connect the column to the integrated circuit structure.

2. The method of manufacturing an integrated circuit packaging system according to claim 1 wherein forming the gamma connector includes:
   forming a short via in direct contact with the integrated circuit structure;
   forming a long via in direct contact with the column; and
   forming a redistribution layer directly connecting between the short via and the long via.

3. The method of manufacturing an integrated circuit packaging system according to claim 1 further comprising:
   forming an insulator mask above the gamma connector to expose a connection pad exposed from the insulator mask.

4. The method of manufacturing an integrated circuit packaging system according to claim 1 wherein providing the routable layer includes providing the routable layer having the column arranged in an array or staggered rows.

5. The method of manufacturing an integrated circuit packaging system according to claim 1 wherein:
   providing the routable layer having the column includes providing the column having vertical sides; and
   mounting the integrated circuit structure includes mounting the integrated circuit structure partially covered with a die attach adhesive there below, and the die attach adhesive surrounds the vertical sides near the integrated circuit structure yet leaves portions of the vertical sides exposed from the die attach adhesive.

6. A method of manufacture of an integrated circuit packaging system comprising:
   providing a carrier;
   forming a routable layer having a column to the carrier;
   mounting an integrated circuit structure in direct contact with the column;
   forming an encapsulation around the integrated circuit structure and the column;
   forming gamma connector through and over the encapsulation to electrically connect the column to the integrated circuit structure; and
   removing the carrier.

7. The method of manufacturing an integrated circuit packaging system according to claim 6 wherein:
   forming the routable layer includes forming the column with vertical sides; and
   forming the encapsulation includes forming the encapsulation surrounding part of the vertical sides yet leaves portions of the vertical sides exposed from the encapsulation.

8. The method of manufacturing an integrated circuit packaging system according to claim 6 wherein:
   mounting the routable layer having the column includes providing the column having vertical sides, and
   further comprising:
   forming a bump in direct contact with the vertical sides of the column and in direct contact with the encapsulation.

9. The method of manufacturing an integrated circuit packaging system according to claim 6 further comprising mounting a top package to the gamma connector above the integrated circuit structure.

10. The method of manufacturing an integrated circuit packaging system according to claim 6 wherein:
    forming the encapsulation includes forming the encapsulation having a top side and an opening exposing the integrated circuit structure; and further comprising:
    mounting an external chip having an external active side in the opening with the external active side below the top side.

11. An integrated circuit packaging system comprising:
    a routable layer having a column;
    an integrated circuit structure mounted in direct contact with the column; and
    a gamma connector formed to electrically connect the column to the integrated circuit structure.

12. The integrated circuit packaging system according to claim 11 wherein the gamma connector includes:
    a short via in direct contact with the integrated circuit structure;
    a long via in direct contact with the column; and
    a redistribution layer directly connected between the short via and the long via.

13. The integrated circuit packaging system according to claim 11 further comprising:
    an insulator mask above the gamma connector to expose a connection pad exposed from the insulator mask.

14. The integrated circuit packaging system according to claim 11 wherein the routable layer has the column arranged in an array or staggered rows.

15. The integrated circuit packaging system according to claim 11 wherein:
    the column have vertical sides; and
    further comprising:
    a die attach adhesive surrounding the vertical sides near the integrated circuit structure yet leaving portions of the vertical sides exposed from the die attach adhesive.

16. The integrated circuit packaging system according to claim 11 further comprising:
    an encapsulation around the integrated circuit structure and the column.

17. The integrated circuit packaging system according to claim 16 wherein:
    the column have vertical sides; and
    the encapsulation surrounds part of the vertical sides yet leaves portions of the vertical sides exposed from the encapsulation.

18. The integrated circuit packaging system according to claim 16 wherein:
    the column have vertical sides; and further comprising:
    a bump in direct contact with the vertical sides of the column and in direct contact with the encapsulation.

19. The integrated circuit packaging system according to claim 16 further comprising a top package mounted to the vias above the integrated circuit structure.

20. The integrated circuit packaging system according to claim 16 wherein:
   the encapsulation has a top side and an opening exposing the integrated circuit structure; and further comprising:
   an external chip having an external active side mounted in the opening with the external active side below the top side.

\* \* \* \* \*